US012543449B2

(12) United States Patent
Matsumoto

(10) Patent No.: US 12,543,449 B2
(45) Date of Patent: Feb. 3, 2026

(54) DISPLAY DEVICE INCLUDING RIB AND MULTI-PORTION PARTITION

(71) Applicant: Magnolia White Corporation, Tokyo (JP)

(72) Inventor: Yuko Matsumoto, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 356 days.

(21) Appl. No.: 18/165,952

(22) Filed: Feb. 8, 2023

(65) Prior Publication Data

US 2023/0301141 A1 Sep. 21, 2023

(30) Foreign Application Priority Data

Feb. 15, 2022 (JP) ................................ 2022-021352

(51) Int. Cl.
*H10K 59/12* (2023.01)
*H10K 59/122* (2023.01)
(Continued)

(52) U.S. Cl.
CPC ..... *H10K 59/122* (2023.02); *H10K 59/80515* (2023.02); *H10K 59/873* (2023.02); *H10K 50/15* (2023.02); *H10K 50/16* (2023.02); *H10K 50/17* (2023.02); *H10K 50/171* (2023.02); *H10K 50/844* (2023.02)

(58) Field of Classification Search
CPC ........... H10K 59/122; H10K 59/80515; H10K 59/873; H10K 59/352; H10K 59/127; H10K 50/844; H10K 50/15; H10K 50/16; H10K 50/17; H10K 50/171
See application file for complete search history.

(56) References Cited

U.S. PATENT DOCUMENTS 9,960,216 B2 * 5/2018 Lee ................. H10K 59/80522
10,971,551 B2 * 4/2021 Wang ................... H10K 59/122
(Continued)

FOREIGN PATENT DOCUMENTS

| JP | 2000-195677 A | 7/2000 |
|---|---|---|
| JP | 2001068267 A | 3/2001 |

(Continued)

OTHER PUBLICATIONS

Japanese Office Action issued Nov. 4, 2025, in corresponding JP Application No. 2022-021352, 9pp.

*Primary Examiner* — Ida M Soward
(74) *Attorney, Agent, or Firm* — XSENSUS LLP

(57) ABSTRACT

A display device includes an organic insulating layer, and a barrier layer formed of an inorganic insulating material and provided on the organic insulating layer. The display device also includes a rib formed of an inorganic insulating material and provided on the barrier layer, a partition including a lower portion located immediately above the barrier layer and provided on the rib, and an upper portion provided on the lower portion and protruding from a side surface of the lower portion. Further, the display device includes a lower electrode including an end portion between the organic insulating layer and the rib, an organic layer including a first portion provided on the lower electrode, and an upper electrode including a first portion provided on the first portion of the organic layer.

14 Claims, 15 Drawing Sheets

(51) Int. Cl.
  *H10K 59/80* (2023.01)
  *H10K 50/15* (2023.01)
  *H10K 50/16* (2023.01)
  *H10K 50/17* (2023.01)
  *H10K 50/844* (2023.01)

(56) References Cited

U.S. PATENT DOCUMENTS

| | | | | |
|---|---|---|---|---|
| 11,610,954 | B1* | 3/2023 | Lin | H10K 59/122 |
| 12,232,353 | B2* | 2/2025 | So | H10K 59/80521 |
| 12,389,742 | B2* | 8/2025 | Helander | H10H 20/84 |
| 2004/0160170 | A1 | 8/2004 | Sato et al. | |
| 2009/0009069 | A1* | 1/2009 | Takata | H10K 50/824 |
| | | | | 445/24 |
| 2014/0183479 | A1* | 7/2014 | Park | H10K 59/1315 |
| | | | | 438/34 |
| 2014/0312323 | A1* | 10/2014 | Park | H10K 59/80516 |
| | | | | 438/23 |
| 2016/0079325 | A1* | 3/2016 | Lee | H10K 71/00 |
| | | | | 438/26 |
| 2016/0126498 | A1* | 5/2016 | Kim | H10K 50/844 |
| | | | | 257/40 |
| 2016/0149156 | A1* | 5/2016 | Kim | H10K 59/121 |
| | | | | 438/46 |
| 2016/0351846 | A1* | 12/2016 | Kim | H10K 59/121 |
| 2017/0194398 | A1* | 7/2017 | Kim | H10K 59/352 |
| 2018/0212004 | A1* | 7/2018 | Hirota | H10K 59/80515 |
| 2018/0342564 | A1 | 11/2018 | Hanari | |
| 2019/0363275 | A1 | 11/2019 | Ochi et al. | |
| 2020/0168670 | A1* | 5/2020 | Kim | H10D 86/451 |
| 2021/0066419 | A1* | 3/2021 | Byun | H10K 71/00 |
| 2021/0202904 | A1* | 7/2021 | Shin | H10K 71/00 |
| 2022/0077251 | A1* | 3/2022 | Choung | H10K 59/873 |
| 2022/0102449 | A1* | 3/2022 | Kim | G06F 3/0412 |
| 2022/0130922 | A1* | 4/2022 | Park | H10K 59/80515 |

FOREIGN PATENT DOCUMENTS

| | | | | | |
|---|---|---|---|---|---|
| JP | 2004-207217 | A | | 7/2004 | |
| JP | 2008135325 | A | * | 6/2008 | H10K 59/80522 |
| JP | 2009-32673 | A | | 2/2009 | |
| JP | 2010-118191 | A | | 5/2010 | |
| JP | 2011034849 | A | | 2/2011 | |
| JP | 2018-200787 | A | | 12/2018 | |
| KR | 20040085383 | A | * | 10/2004 | H05B 11/10 |
| WO | 2018/179308 | A1 | | 10/2018 | |

\* cited by examiner

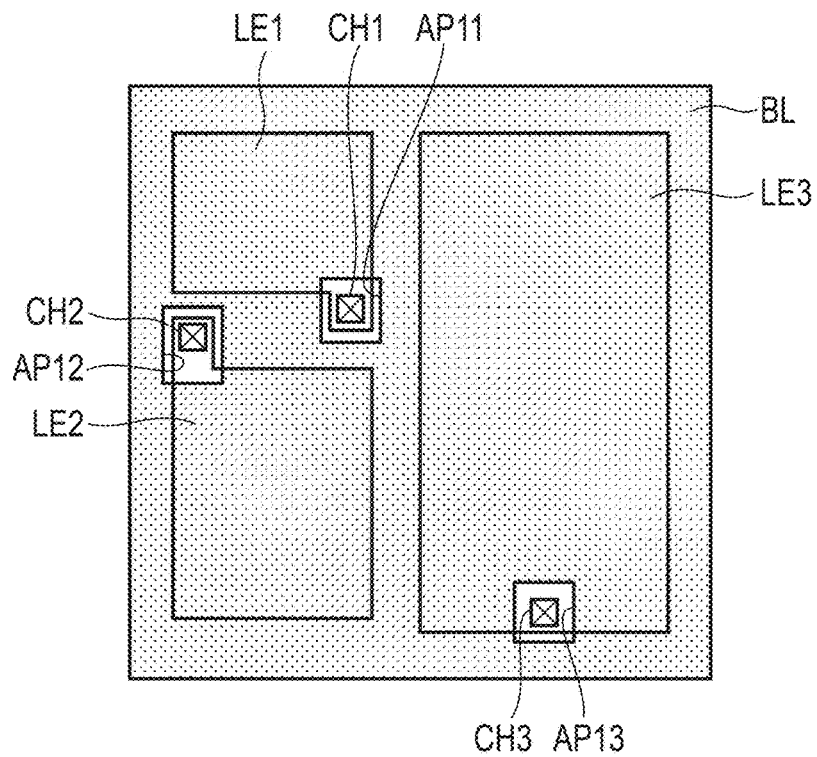
F I G. 4
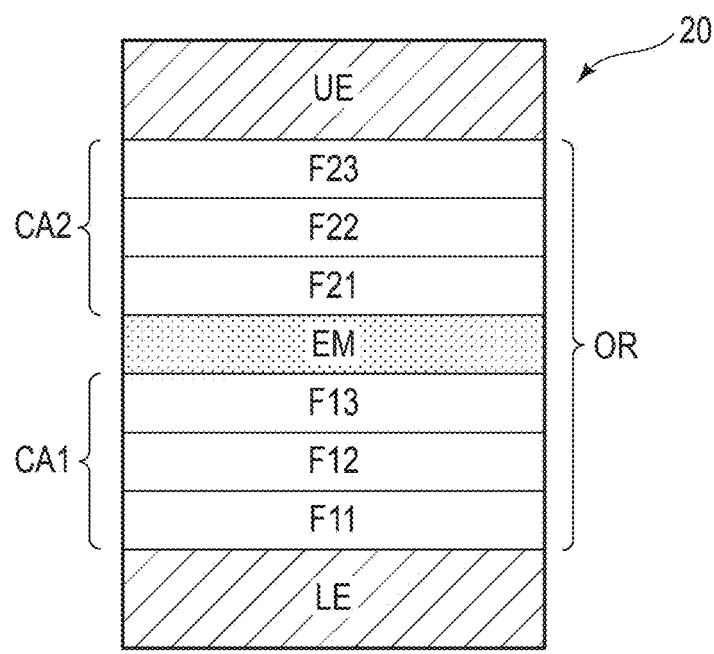
F I G. 5

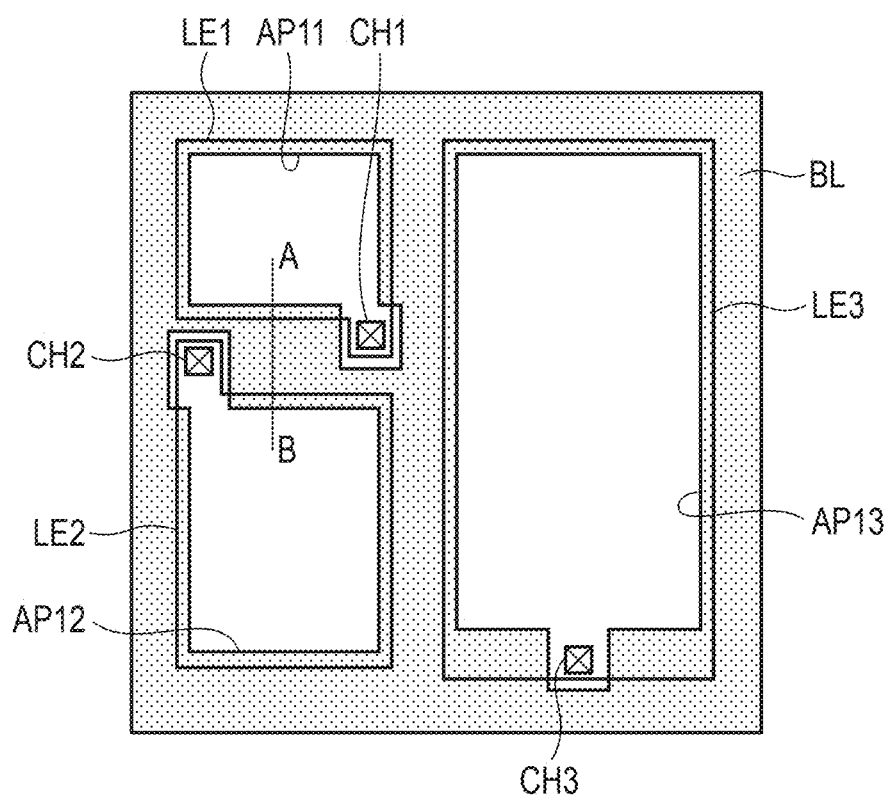
F I G. 13

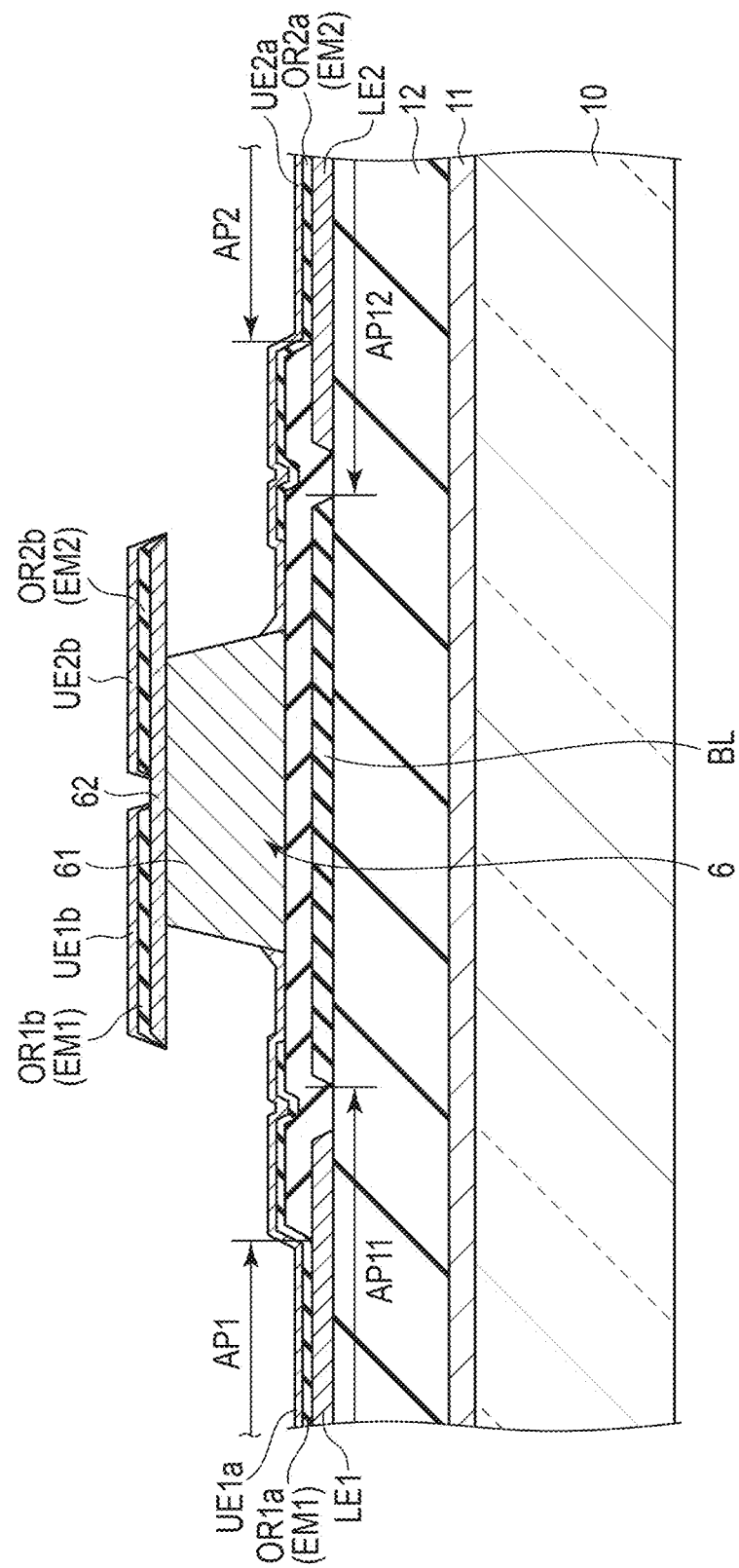
F I G. 16

DISPLAY DEVICE INCLUDING RIB AND MULTI-PORTION PARTITION

CROSS-REFERENCE TO RELATED APPLICATIONS

This application is based upon and claims the benefit of priority from Japanese Patent Application No. 2022-021352, filed Feb. 15, 2022, the entire contents of which are incorporated herein by reference.

FIELD

Embodiments described herein relate generally to a display device.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole-transport layer and an electron-transport layer in addition to a light emitting layer.

In the process of manufacturing such a display element, a technique which prevents the reduction in reliability has been required.

BRIEF DESCRIPTION OF THE DRAWINGS

FIG. 4 is a plan view showing a configuration example of a barrier layer BL.

FIG. 5 is a diagram showing an example of the configuration of a display element 20.

FIG. 13 is a plan view showing another configuration example of the barrier layer BL.

FIG. 16 is a cross-sectional view showing another configuration example of the display device.

DETAILED DESCRIPTION

Figure 1:
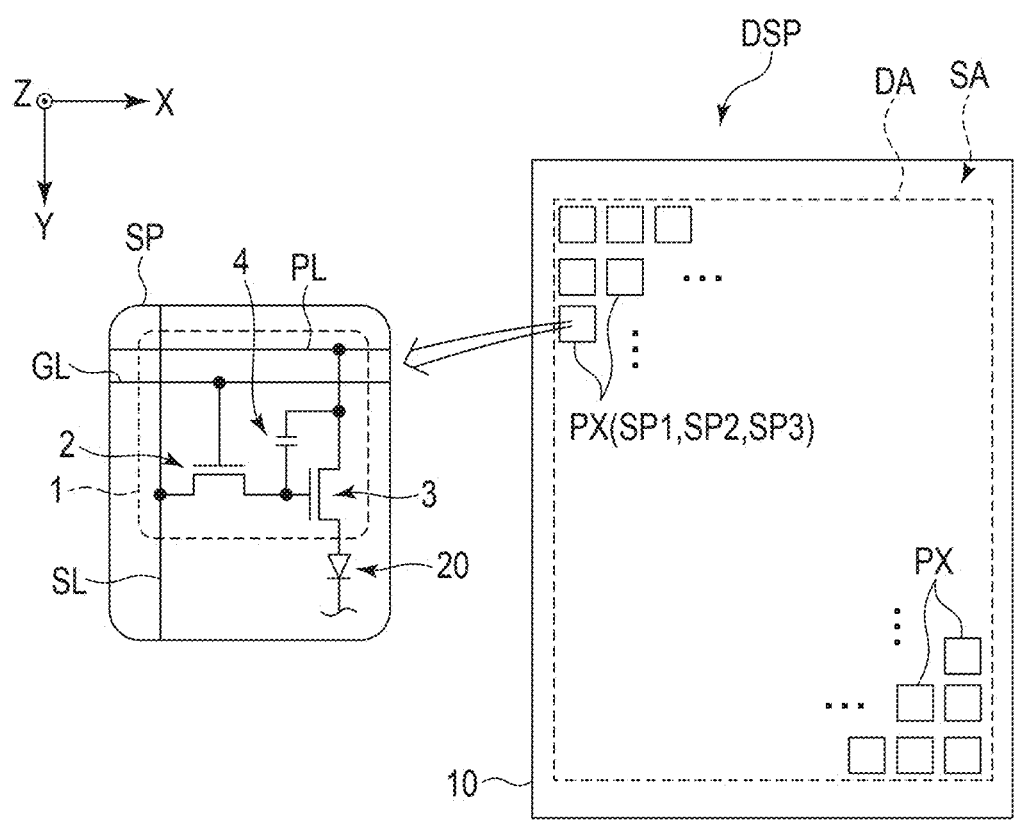
FIG. 1 is a diagram showing a configuration example of a display device DSP.

Embodiments described herein aim to provide a display device which can prevent the reduction in reliability.

In general, according to one embodiment, a display device comprises a substrate, an organic insulating layer provided above the substrate, a barrier layer formed of an inorganic insulating material and provided on the organic insulating layer, a rib formed of an inorganic insulating material and provided on the barrier layer, a partition comprising a lower portion located immediately above the barrier layer and provided on the rib, and an upper portion provided on the lower portion and protruding from a side surface of the lower portion, a lower electrode comprising an end portion between the organic insulating layer and the rib, an organic layer comprising a first portion provided on the lower electrode in an aperture of the rib and spaced apart from the lower portion of the partition, and a second portion provided on the upper portion, the first and second portions including light emitting layers formed of a same material, an upper electrode comprising a first portion which is provided on the first portion of the organic layer and is in contact with the lower portion of the partition, and a second portion provided on the second portion of the organic layer, a cap layer comprising a first portion provided on the first portion of the upper electrode, and a second portion provided on the second portion of the upper electrode, and a sealing layer which covers the first and second portions of the cap layer.

The embodiments provide a display device which can prevent the reduction in reliability.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. A plan view is defined as appearance when various types of elements are viewed parallel to the third direction Z.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in a plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a red subpixel SP1, a green subpixel SP2 and a blue subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element. For example, subpixel SP1 comprises a display element 20 which emits light in a red wavelength range. Subpixel SP2 comprises a display element 20 which emits light in a green wavelength range. Subpixel SP3 comprises a display element 20 which emits light in a blue wavelength range.

Figure 2:
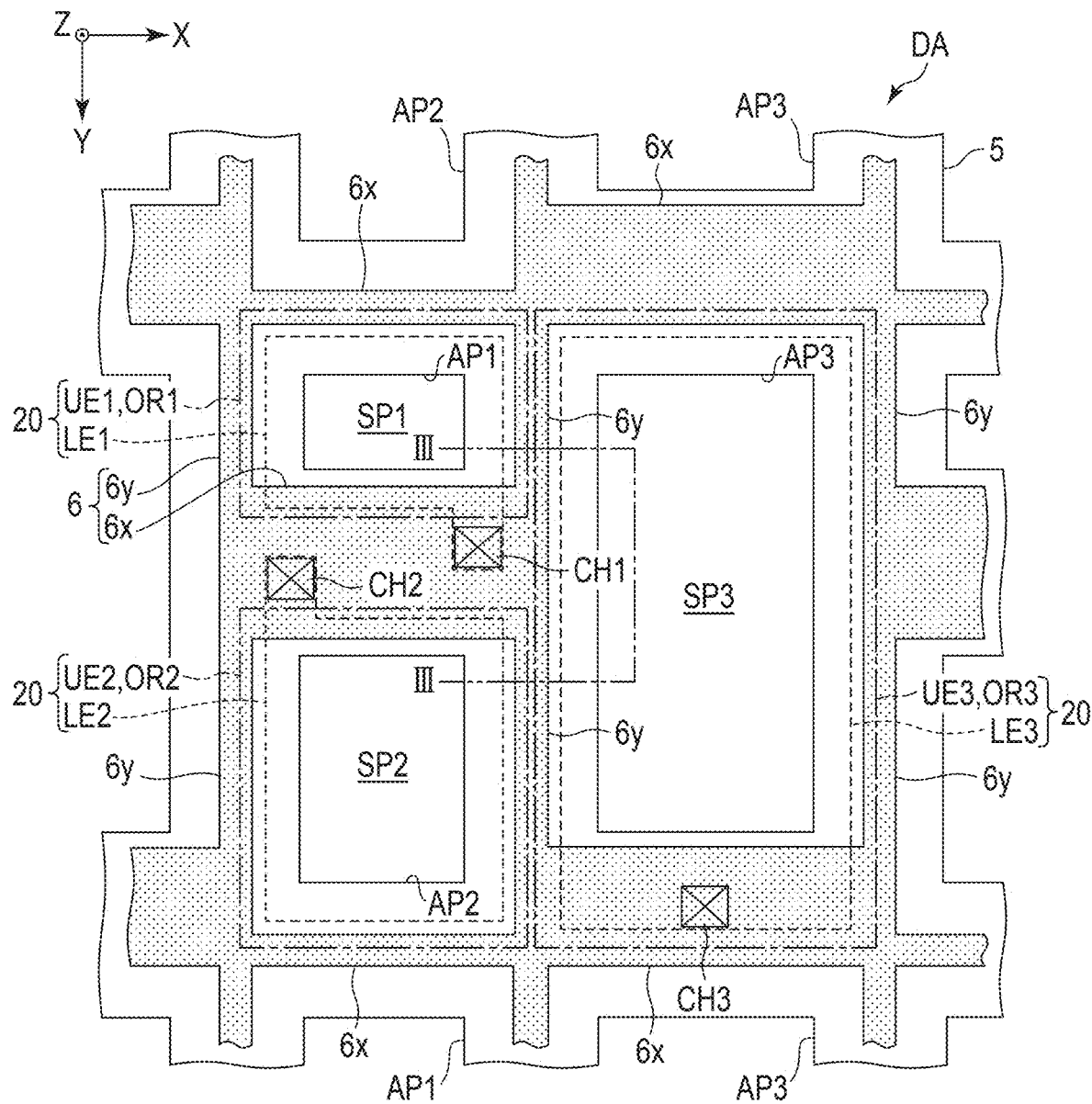
FIG. 2 is a diagram showing an example of the layout of subpixels SP1, SP2 and SP3.

FIG. 2 is a diagram showing an example of the layout of subpixels SP1, SP2 and SP3.

In the example of FIG. 2, subpixels SP1 and SP2 are arranged in the second direction Y. Further, each of subpixels SP1 and SP2 is adjacent to subpixel SP3 in the first direction X.

When subpixels SP1, SP2 and SP3 are provided in line with this layout, in the display area DA, a column in which subpixels SP1 and SP2 are alternately provided in the second direction Y and a column in which a plurality of subpixels SP3 are provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively. In the example of FIG. 2, the aperture AP2 is larger than the aperture AP1, and the aperture AP3 is larger than the aperture AP2.

The partition 6 overlaps the rib 5 as seen in plan view. The partition 6 comprises a plurality of first partitions 6x extending in the first direction X and a plurality of second partitions 6y extending in the second direction Y. The first partitions 6x are provided between the apertures AP1 and AP2 which are adjacent to each other in the second direction Y and between two apertures AP3 which are adjacent to each other in the second direction Y. Each second partition 6y is provided between the apertures AP1 and AP3 which are adjacent to each other in the first direction X and between the apertures AP2 and AP3 which are adjacent to each other in the first direction X.

In the example of FIG. 2, the first partitions 6x and the second partitions 6y are connected to each other. Thus, the partition 6 is formed into a grating shape surrounding the apertures AP1, AP2 and AP3 as a whole. In other words, the partition 6 comprises apertures in subpixels SP1, SP2 and SP3 in a manner similar to that of the rib 5.

Subpixel SP1 comprises a lower electrode LE1, an upper electrode UE1 and an organic layer OR1 overlapping the aperture AP1. Subpixel SP2 comprises a lower electrode LE2, an upper electrode UE2 and an organic layer OR2 overlapping the aperture AP2. Subpixel SP3 comprises a lower electrode LE3, an upper electrode UE3 and an organic layer OR3 overlapping the aperture AP3.

In the example of FIG. 2, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. The peripheral portion of each of the lower electrodes LE1, LE2 and LE3 overlaps the rib 5. The outer shape of the upper electrode UE1 is substantially coincident with the outer shape of the organic layer OR1. The peripheral portion of each of the upper electrode UE1 and the organic layer OR1 overlaps the partition 6. The outer shape of the upper electrode UE2 is substantially coincident with the outer shape of the organic layer OR2. The peripheral portion of each of the upper electrode UE2 and the organic layer OR2 overlaps the partition 6. The outer shape of the upper electrode UE3 is substantially coincident with the outer shape of the organic layer OR3. The peripheral portion of each of the upper electrode UE3 and the organic layer OR3 overlaps the partition 6.

The lower electrode LE1, the upper electrode UE1 and the organic layer OR1 constitute the display element 20 of subpixel SP1. The lower electrode LE2, the upper electrode UE2 and the organic layer OR2 constitute the display element 20 of subpixel SP2. The lower electrode LE3, the upper electrode UE3 and the organic layer OR3 constitute the display element 20 of subpixel SP3. The lower electrodes LE1, LE2 and LE3 correspond to, for example, the anodes of the display elements 20. The upper electrodes UE1, UE2 and UE3 correspond to the cathodes of the display elements 20 or a common electrode.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

Figure 3:
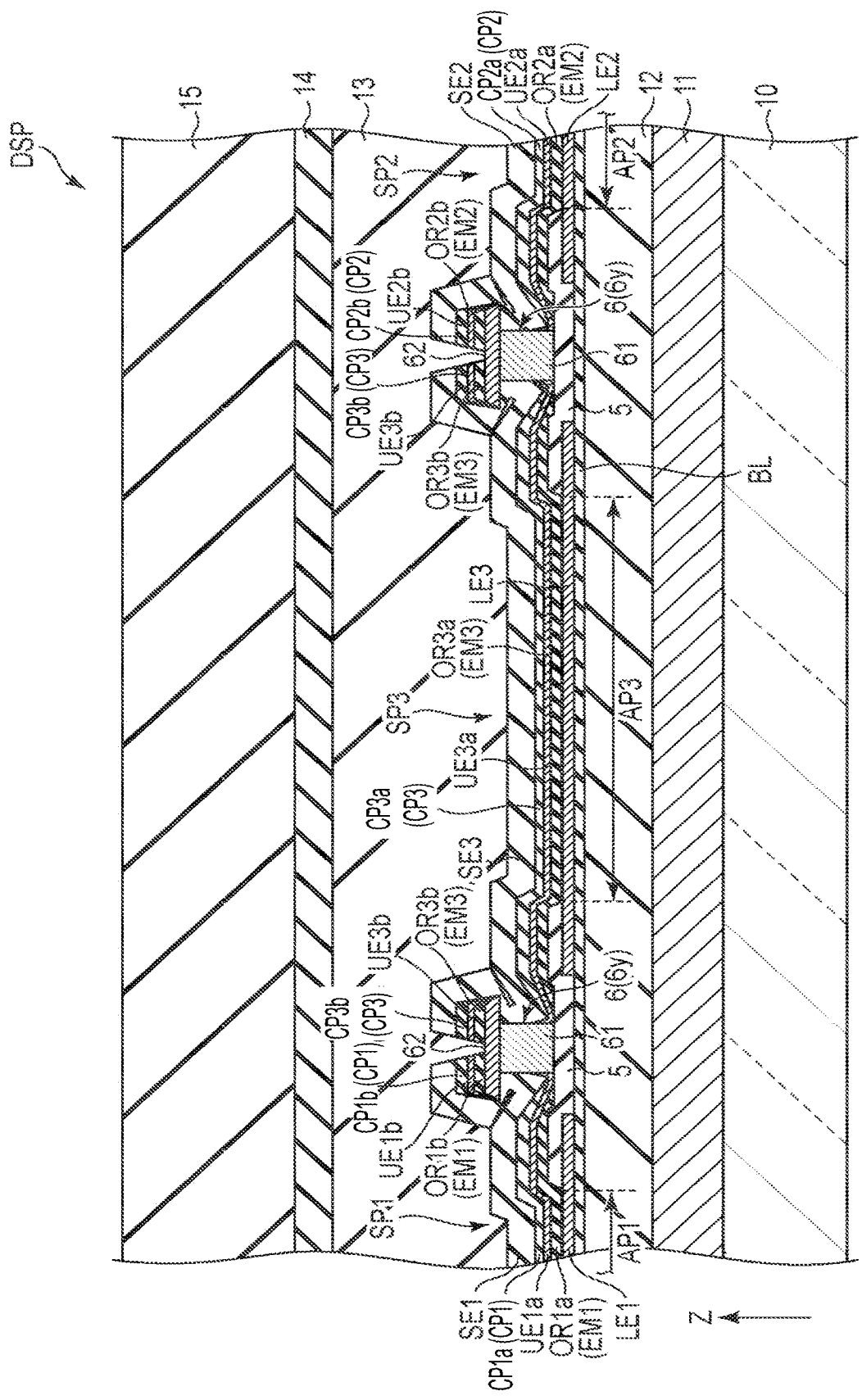
FIG. 3 is a schematic cross-sectional view of the display device DSP along the III-III line of FIG. 2.

FIG. 3 is a schematic cross-sectional view of the display device DSP along the III-III line of FIG. 2.

A circuit layer 11 is provided on the substrate 10 described above. The circuit layer 11 includes various circuits such as the pixel circuit 1, and various lines such as scanning line GL, signal line SL and power line PL shown in FIG. 1. The circuit layer 11 is covered with an insulating layer 12. The insulating layer 12 functions as a planarization film which planarizes the irregularities formed by the circuit layer 11. A barrier layer BL is provided on the insulating layer 12. In the example shown in the figure, the barrier layer BL is in contact with the insulating layer 12 and covers substantially the entire surface of the insulating layer 12.

The lower electrodes LE1, LE2 and LE3 are provided on the barrier layer BL. The rib 5 is provided on the barrier layer BL and the lower electrodes LE1, LE2 and LE3. The end portions of the lower electrodes LE1, LE2 and LE3 are covered with the rib 5. In other words, the end portions of the lower electrodes LE1, LE2 and LE3 are provided between the insulating layer 12 and the rib 5. In the example shown in the figure, the end portions of the lower electrodes LE1, LE2 and LE3 are provided between the barrier layer BL and the rib 5. Of the lower electrodes LE1, LE2 and LE3, between the lower electrodes which are adjacent to each other, the barrier layer BL is covered with the rib 5. At positions overlapping the apertures AP1, AP2 and AP3 of the rib 5, the lower electrodes LE1, LE2 and LE3 are provided on the barrier layer BL.

The partition 6 includes a lower portion (stem) 61 located immediately above the barrier layer BL and provided on the rib 5, and an upper portion (shade) 62 provided on the lower portion 61. The upper portion 62 has a width greater than that of the lower portion 61. By this configuration, in FIG. 3, the both end portions of the upper portion 62 protrude relative to the side surfaces of the lower portion 61. This shape of the partition 6 may be called an overhang shape.

Immediately under the partition 6, the barrier layer BL is provided between the insulating layer 12 and the rib 5. The barrier layer BL is provided between the insulating layer 12 and the rib 5 between the side surface of the lower portion 61 of the partition 6 and the end portion of each of the lower electrodes LE1, LE2 and LE3.

The organic layer OR1 shown in FIG. 2 includes first and second portions OR1a and OR1b spaced apart from each other as shown in FIG. 3. The first portion OR1a is in contact with the lower electrode LE1 through the aperture AP1, covers the lower electrode LE1 and overlaps part of the rib 5. The second portion OR1b is provided on the upper portion 62.

The upper electrode UE1 shown in FIG. 2 includes first and second portions UE1a and UE1b spaced apart from each other as shown in FIG. 3. The first portion UE1a faces the lower electrode LE1 and is provided on the first portion OR1a. Further, the first portion UE1a is in contact with a side surface of the lower portion 61. The second portion UE1b is located above the partition 6 and is provided on the second portion OR1b.

The organic layer OR2 shown in FIG. 2 includes first and second portions OR2a and OR2b spaced apart from each other as shown in FIG. 3. The first portion OR2a is in contact with the lower electrode LE2 through the aperture AP2, covers the lower electrode LE2 and overlaps part of the rib 5. The second portion OR2b is provided on the upper portion 62.

The upper electrode UE2 shown in FIG. 2 includes first and second portions UE2a and UE2b spaced apart from each other as shown in FIG. 3. The first portion UE2a faces the lower electrode LE2 and is provided on the first portion OR2a. Further, the first portion UE2a is in contact with a side surface of the lower portion 61. The second portion UE2b is located above the partition 6 and is provided on the second portion OR2b.

The organic layer OR3 shown in FIG. 2 includes first and second portions OR3a and OR3b spaced apart from each other as shown in FIG. 3. The first portion OR3a is in contact with the lower electrode LE3 through the aperture AP3, covers the lower electrode LE3 and overlaps part of the rib 5. The second portion OR3b is provided on the upper portion 62.

The upper electrode UE3 shown in FIG. 2 includes first and second portions UE3a and UE3b spaced apart from each other as shown in FIG. 3. The first portion UE3a faces the lower electrode LE3 and is provided on the first portion OR3a. Further, the first portion UE3a is in contact with a side surface of the lower portion 61. The second portion UE3b is located above the partition 6 and is provided on the second portion OR3b.

In the example shown in FIG. 3, subpixels SP1, SP2 and SP3 include cap layers (optical adjustment layers) CP1, CP2 and CP3 for adjusting the optical property of the light emitted from the light emitting layers of the organic layers OR1, OR2 and OR3.

The cap layer CP1 includes first and second portions CP1a and CP1b spaced apart from each other. The first portion CP1a is located in the aperture AP1 and is provided on the first portion UE1a. The second portion CP1b is located above the partition 6 and is provided on the second portion UE1b.

The cap layer CP2 includes first and second portions CP2a and CP2b spaced apart from each other. The first portion CP2a is located in the aperture AP2 and is provided on the first portion UE2a. The second portion CP2b is located above the partition 6 and is provided on the second portion UE2b.

The cap layer CP3 includes first and second portions CP3a and CP3b spaced apart from each other. The first portion CP3a is located in the aperture AP3 and is provided on the first portion UE3a. The second portion CP3b is located above the partition 6 and is provided on the second portion UE3b.

Sealing layers SE1, SE2 and SE3 are provided in subpixels SP1, SP2 and SP3, respectively. The sealing layer SE1 continuously covers the members of subpixel SP1 including the first portion CP1a, the partition 6 and the second portion CP1b. The sealing layer SE2 continuously covers the members of subpixel SP2 including the first portion CP2a, the partition 6 and the second portion CP2b. The sealing layer SE3 continuously covers the members of subpixel SP3 including the first portion CP3a, the partition 6 and the second portion CP3b.

In the example of FIG. 3, the second portion OR1b, the second portion UE1b, the second portion CP1b and the sealing layer SE1 on the partition 6 between subpixels SP1 and SP3 are spaced apart from the second portion OR3b, the second portion UE3b, the second portion CP3b and the sealing layer SE3 on this partition 6. The second portion OR2b, the second portion UE2b, the second portion CP2b and the sealing layer SE2 on the partition 6 between subpixels SP2 and SP3 are spaced apart from the second portion OR3b, the second portion UE3b, the second portion CP3b and the sealing layer SE3 on this partition 6.

The sealing layers SE1, SE2 and SE3 are covered with a resinous layer 13. The resinous layer 13 is covered with a sealing layer 14. Further, the sealing layer 14 is covered with a resinous layer 15.

The insulating layer 12 is an organic insulating layer. The barrier layer BL, the rib 5, the sealing layers SE1, SE2 and SE3 and the sealing layer 14 are inorganic insulating layers. This barrier layer BL comprises a function of interrupting a moisture path from the insulating layer 12 to the organic layers OR1, OR2 and OR3 and a moisture path from the insulating layer 12 to the upper electrodes UE1, UE2 and UE3. The provision of the barrier layer BL prevents moisture from degrading the organic layers OR1, OR2 and OR3 and the upper electrodes UE1, UE2 and UE3.

The barrier layer BL and the rib 5 are formed of inorganic insulating materials different from each other.

The rib 5 and the sealing layers SE1, SE2 and SE3 are formed of the same inorganic insulating material.

The barrier layer BL and the sealing layers SE1, SE2 and SE3 are formed of inorganic insulating materials different from each other.

For example, the barrier layer BL is formed of silicon oxide (SiOx) or silicon oxynitride (SiON). The rib 5 is formed of, for example, silicon nitride (SiNx). The sealing layers 14, SE1, SE2 and SE3 are formed of, for example, silicon nitride (SiNx).

The thickness of the rib 5 is sufficiently less than that of the partition 6 and the insulating layer 12. For example, the thickness of the rib 5 is greater than or equal to 200 nm but less than or equal to 400 nm. The thickness of the barrier layer BL is equal to that of the rib 5 or less than that of the rib 5.

The lower portions 61 of the partitions 6 are formed of a conductive material and are electrically connected to the first portions UE1a, UE2a and UE3a of the upper electrodes. Both the lower portion 61 and the upper portion 62 of the partition 6 may be conductive.

The lower electrodes LE1, LE2 and LE3 may be formed of a transparent conductive material such as ITO or may comprise a multilayer structure of a metal material such as silver (Ag) and a transparent conductive material. The upper electrodes UE1, UE2 and UE3 are formed of, for example, a metal material such as an alloy of magnesium and silver (MgAg). The upper electrodes UE1, UE2 and UE3 may be formed of a transparent conductive material such as ITO.

When the potential of the lower electrodes LE1, LE2 and LE3 is relatively higher than that of the upper electrodes UE1, UE2 and UE3, the lower electrodes LE1, LE2 and LE3 correspond to anodes, and the upper electrodes UE1, UE2 and UE3 correspond to cathodes. When the potential of the upper electrodes UE1, UE2 and UE3 is relatively higher than that of the lower electrodes LE1, LE2 and LE3, the upper electrodes UE1, UE2 and UE3 correspond to anodes, and the lower electrodes LE1, LE2 and LE3 correspond to cathodes.

The organic layers OR1, OR2 and OR3 include a plurality of functional layers. The first and second portions OR1a and OR1b of the organic layer OR1 include light emitting layers EM1 formed of the same material. The first and second portions OR2a and OR2b of the organic layer OR2 include light emitting layers EM2 formed of the same material. The first and second portions OR3a and OR3b of the organic layer OR3 include light emitting layers EM3 formed of the same material. The light emitting layer EM1, the light emitting layer EM2 and the light emitting layer EM3 are formed of materials which emit light of different wavelength ranges.

The cap layers CP1, CP2 and CP3 are formed by, for example, a multilayer body of transparent thin films. As the thin films, the multilayer body may include a thin film formed of an inorganic material and a thin film formed of an organic material. These thin films have refractive indices different from each other. The materials of the thin films constituting the multilayer body are different from those of the upper electrodes UE1, UE2 and UE3 and are also different from those of the sealing layers SE1, SE2 and SE3. It should be noted that the cap layers CP1, CP2 and CP3 may be omitted.

Common voltage is applied to the partition 6. This common voltage is applied to, of the upper electrodes, the first portions UE1a, UE2a and UE3a which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer EM1 of the first portion OR1a of the organic layer OR1 emits light in a red wavelength range. When a potential difference is formed between the lower electrode LE2 and the upper electrode UE2, the light emitting layer EM2 of the first portion OR2a of the organic layer OR2 emits light in a green wavelength range. When a potential difference is formed between the lower electrode LE3 and the upper electrode UE3, the light emitting layer EM3 of the first portion OR3a of the organic layer OR3 emits light in a blue wavelength range.

As another example, the light emitting layers of the organic layers OR1, OR2 and OR3 may emit light exhibiting the same color (for example, white). In this case, the display device DSP may comprise color filters which convert the light emitted from the light emitting layers into light exhibiting colors corresponding to subpixels SP1, SP2 and SP3. The display device DSP may comprise a layer including a quantum dot which generates light exhibiting colors corresponding to subpixels SP1, SP2 and SP3 by the excitation caused by the light emitted from the light emitting layers.

FIG. 4 is a plan view showing a configuration example of the barrier layer BL. FIG. 4 shows only the barrier layer BL and the lower electrodes LE1, LE2 and LE3. The other structural elements are omitted in the figure.

As seen in plan view, the lower electrodes LE1, LE2 and LE3 overlap the barrier layer BL. The barrier layer BL comprises an aperture AP11 overlapping the contact hole CH1, an aperture AP12 overlapping the contact hole CH2 and an aperture AP13 overlapping the contact hole CH3.

In other words, the lower electrode LE1 is connected to the pixel circuit 1 of subpixel SP1 shown in FIG. 1 through the aperture AP11 and the contact hole CH1. Similarly, the lower electrode LE2 is connected to the pixel circuit 1 of subpixel SP2 through the aperture AP12 and the contact hole CH2. The lower electrode LE3 is connected to the pixel circuit 1 of subpixel SP3 through the aperture AP13 and the contact hole CH3.

It should be noted that a through hole may be provided in the barrier layer BL in the surrounding area SA shown in FIG. 1 to eliminate moisture from the insulating layer 12.

FIG. 5 is a diagram showing an example of the configuration of the display element 20.

The lower electrode LE shown in FIG. 5 corresponds to each of the lower electrodes LE1, LE2 and LE3 of FIG. 3. The organic layer OR shown in FIG. 5 corresponds to each of the organic layers OR1, OR2 and OR3 of FIG. 3. The upper electrode UE shown in FIG. 5 corresponds to each of the upper electrodes UE1, UE2 and UE3 of FIG. 3.

The organic layer OR comprises a carrier adjustment layer CA1, a light emitting layer EM and a carrier adjustment layer CA2. The carrier adjustment layer CA1 is located between the lower electrode LE and the light emitting layer EM. The carrier adjustment layer CA2 is located between the light emitting layer EM and the upper electrode UE. The carrier adjustment layers CA1 and CA2 include a plurality of functional layers. Hereinafter, this specification explains an example in which the lower electrode LE corresponds to an anode and the upper electrode UE corresponds to a cathode.

The carrier adjustment layer CA1 includes a hole-injection layer F11, a hole-transport layer F12, an electron blocking layer F13 and the like as functional layers. The hole-injection layer F11 is provided on the lower electrode LE. The hole-transport layer F12 is provided on the hole-injection layer F11. The electron blocking layer F13 is provided on the hole-transport layer F12. The light emitting layer EM is provided on the electron blocking layer F13.

The carrier adjustment layer CA2 includes a hole blocking layer F21, an electron-transport layer F22, an electron-injection layer F23 and the like as functional layers. The hole blocking layer F21 is provided on the light emitting layer EM. The electron-transport layer F22 is provided on the hole blocking layer F21. The electron-injection layer F23 is provided on the electron-transport layer F22. The upper electrode UE is provided on the electron-injection layer F23.

In addition to the functional layers described above, the carrier adjustment layers CA1 and CA2 may include other functional layers such as a carrier generation layer as needed, or at least one of the above functional layers may be omitted.

Now, this specification explains an example of the manufacturing method of the display device DSP.

Figure 6:
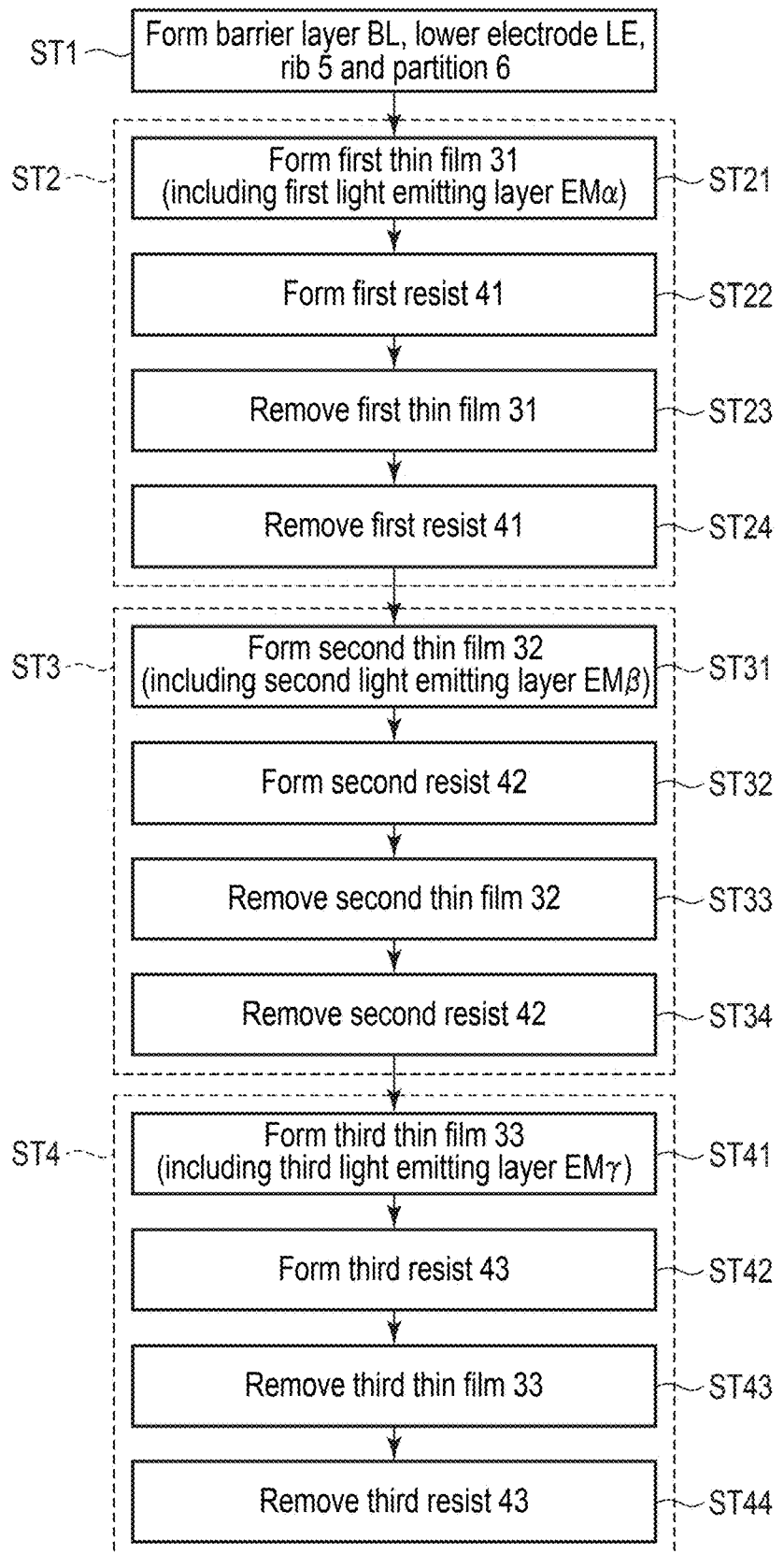
FIG. 6 is a flow diagram for explaining an example of the manufacturing method of the display device DSP.

FIG. 6 is a flow diagram for explaining an example of the manufacturing method of the display device DSP.

The manufacturing method shown here roughly includes the process of preparing a processing substrate SUB which is the base of subpixels SPα, SPβ and SPγ (step ST1), the process of forming subpixel SPα (step ST2), the process of forming subpixel SPβ (step ST3) and the process of forming subpixel SPγ (step ST4). It should be noted that each of subpixels SPα, SPβ and SPγ here is one of the above subpixels SP1, SP2 and SP3.

In step ST1, first, the processing substrate SUB is prepared by forming the barrier layer BL, lower electrodes LEα, LEβ and LEγ, the rib 5 and the partition 6 on the substrate 10. As shown in FIG. 3, the circuit layer 11 and the insulating layer 12 are also formed between the substrate 10 and the barrier layer BL. The details are described later.

In step ST2, first, a first thin film 31 including a first light emitting layer EMα is formed on the processing substrate SUB (step ST21).

Subsequently, a first resist 41 patterned into a predetermined shape is formed on the first thin film 31 (step ST22). Subsequently, part of the first thin film 31 is removed by etching using the first resist 41 as a mask (step ST23). Subsequently, the first resist 41 is removed (step ST24). In this way, subpixel SPα is formed. Subpixel SPα comprises a display element 21 comprising the first thin film 31 having a predetermined shape.

In step ST3, a second thin film 32 including a second light emitting layer EMβ is formed on the processing substrate SUB (step ST31). Subsequently, a second resist 42 patterned into a predetermined shape is formed on the second thin film 32 (step ST32). Subsequently, part of the second thin film 32 is removed by etching using the second resist 42 as a mask (step ST33). Subsequently, the second resist 42 is removed (step ST34). In this way, subpixel SPβ is formed. Subpixel SPβ comprises a display element 22 comprising the second thin film 32 having a predetermined shape.

In step ST4, a third thin film 33 including a third light emitting layer EMγ is formed on the processing substrate SUB (step ST41). Subsequently, a third resist 43 patterned into a predetermined shape is formed on the third thin film 33 (step ST42). Subsequently, part of the third thin film 33 is removed by etching using the third resist 43 as a mask (step ST43). Subsequently, the third resist 43 is removed (step ST44). In this way, subpixel SPγ is formed. Subpixel SPγ comprises a display element 23 comprising the third thin film 33 having a predetermined shape.

The first light emitting layer EMα, the second light emitting layer EMβ and the third light emitting layer EMγ are formed of materials which emit light in wavelength ranges different from each other.

The detailed illustrations of the second thin film 32, the second light emitting layer EMβ, the display element 22, the third thin film 33, the third light emitting layer EMγ and the display element 23 are omitted.

Now, this specification explains step ST1 and step ST2 with reference to FIG. 7 to FIG. 12.

Figure 7:
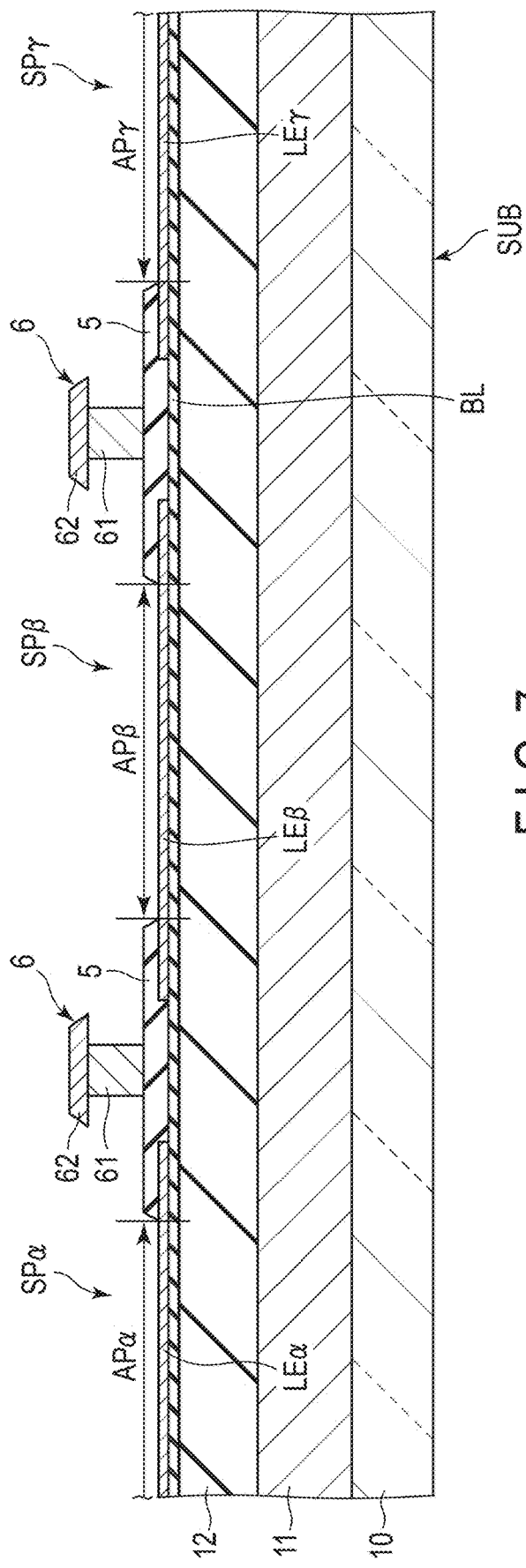
FIG. 7 is a diagram for explaining step ST1.

First, in step ST1, as shown in FIG. 7, the processing substrate SUB is prepared. The process of preparing the processing substrate SUB includes the process of forming the circuit layer 11 on the substrate 10, the process of forming the insulating layer 12 on the circuit layer 11, the process of forming the barrier layer BL on the insulating layer 12, the process of forming the lower electrode LEα of subpixel SPα, the lower electrode LEβ of subpixel SPβ and the lower electrode LEγ of subpixel SPγ on the barrier layer BL, the process of forming the rib 5 comprising apertures APα, APβ and APγ overlapping the lower electrodes LEα, LEβ and LEγ, respectively, and the process of forming the partition 6 including the lower portion 61 provided on the rib 5 and the upper portion 62 provided on the lower portion 61 and protruding from the side surface of the lower portion 61. In FIG. 8 to FIG. 12, the illustrations of the substrate 10 and the circuit layer 11 lower than the insulating layer 12 are omitted.

Figure 8:
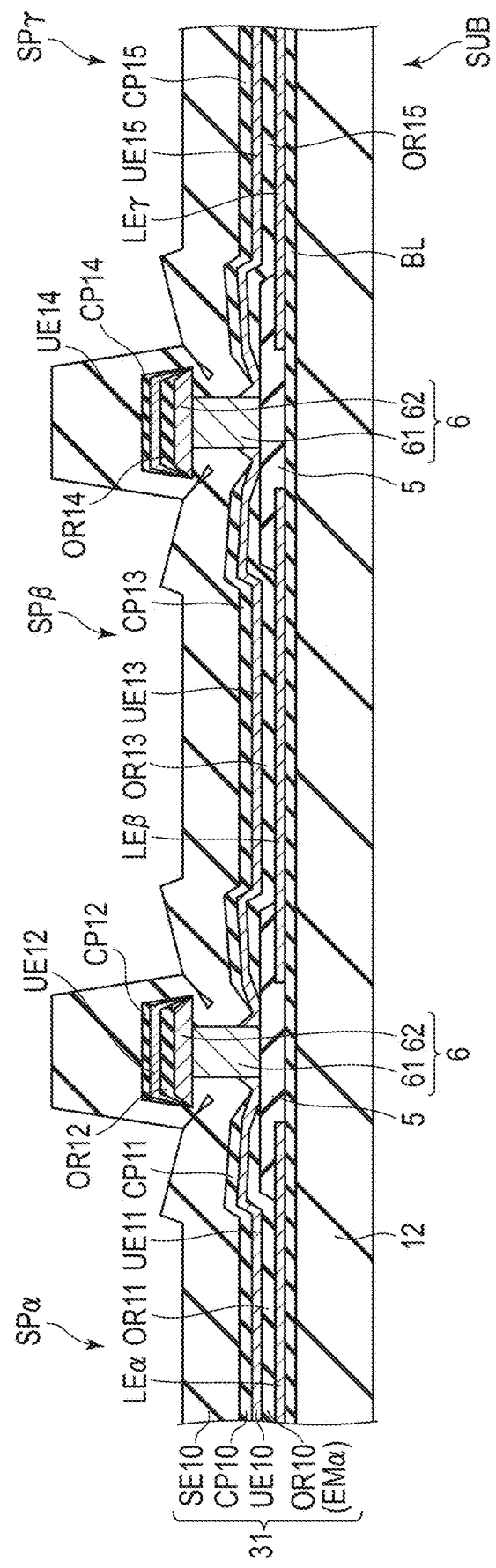
FIG. 8 is a diagram for explaining step ST21.

Subsequently, in step ST21, as shown in FIG. 8, the first thin film 31 is formed over subpixel SPα, subpixel SPβ and subpixel SPγ. The process of forming the first thin film 31 includes, on the processing substrate SUB, the process of forming an organic layer OR10 including the first light emitting layer EMα, the process of forming an upper electrode UE10 on the organic layer OR10, the process of forming a cap layer CP10 on the upper electrode UE10 and the process of forming a sealing layer SE10 on the cap layer CP10. Thus, in the example shown in the figure, the first thin film 31 includes the organic layer OR10, the upper electrode UE10, the cap layer CP10 and the sealing layer SE10.

The organic layer OR10 includes a first organic layer OR11, a second organic layer OR12, a third organic layer OR13, a fourth organic layer OR14 and a fifth organic layer OR15. Each of the first organic layer OR11, the second organic layer OR12, the third organic layer OR13, the fourth organic layer OR14 and the fifth organic layer OR15 includes the first light emitting layer EMα.

The first organic layer OR11 is formed so as to cover the lower electrode LEα. The second organic layer OR12 is spaced apart from the first organic layer OR11 and is located on the upper portion 62 of the partition 6 between the lower electrode LEα and the lower electrode LEB. The third organic layer OR13 is spaced apart from the second organic layer OR12 and is formed so as to cover the lower electrode LEB. The fourth organic layer OR14 is spaced apart from the third organic layer OR13 and is located on the upper portion 62 of the partition 6 between the lower electrode LEβ and the lower electrode LEγ. The fifth organic layer OR15 is spaced apart from the fourth organic layer OR14 and is formed so as to cover the lower electrode LEγ.

The upper electrode UE10 includes a first upper electrode UE11, a second upper electrode UE12, a third upper electrode UE13, a fourth upper electrode UE14 and a fifth upper electrode UE15.

The first upper electrode UE11 is located on the first organic layer OR11 and is in contact with the lower portion 61 of the partition 6 between the lower electrode LEα and the lower electrode LEβ. The second upper electrode UE12 is spaced apart from the first upper electrode UE11 and is located on the second organic layer OR12 between the lower electrode LEα and the lower electrode LEβ. The third upper electrode UE13 is spaced apart from the second upper electrode UE12 and is located on the third organic layer OR13. In the example shown in the figure, the third upper electrode UE13 is in contact with the lower portion 61 of the partition 6 between the lower electrode LEα and the lower electrode LEβ and is in contact with the lower portion 61 of the partition 6 between the lower electrode LEβ and the lower electrode LEγ. However, the third upper electrode UE13 may be in contact with one of these lower portions 61. The fourth upper electrode UE14 is spaced apart from the third upper electrode UE13 and is located on the fourth organic layer OR14 between the lower electrode LEβ and the lower electrode LEγ. The fifth upper electrode UE15 is spaced apart from the fourth upper electrode UE14, is located on the fifth organic layer OR15 and is in contact with the lower portion 61 of the partition 6 between the lower electrode LEβ and the lower electrode LEγ.

The cap layer CP10 includes a first cap layer CP11, a second cap layer CP12, a third cap layer CP13, a fourth cap layer CP14 and a fifth cap layer CP15.

The first cap layer CP11 is located on the first upper electrode UE11. The second cap layer CP12 is spaced apart from the first cap layer CP11 and is located on the second upper electrode UE12. The third cap layer CP13 is spaced apart from the second cap layer CP12 and is located on the third upper electrode UE13. The fourth cap layer CP14 is spaced apart from the third cap layer CP13 and is located on the fourth upper electrode UE14. The fifth cap layer CP15 is spaced apart from the fourth cap layer CP14 and is located on the fifth upper electrode UE15.

The sealing layer SE10 is formed so as to cover the first cap layer CP11, the second cap layer CP12, the third cap layer CP13, the fourth cap layer CP14, the fifth cap layer CP15 and the partition 6. The sealing layer SE10 which covers the partition 6 is in contact with the lower part of the upper portion 62 and is in contact with the side surface of the lower portion 61.

In the example shown in FIG. 8, the rib 5 is covered with the organic layer OR10 and the upper electrode UE10. Thus, the rib 5 is not in contact with the sealing layer SE10. It should be noted that, when none of the organic layer OR10, the upper electrode UE10 and the cap layer CP10 extends to reach the lower portion 61 of the partition 6, of the upper surface of the rib 5, the area located near the partition 6 could be in contact with the sealing layer SE10.

Figure 9:
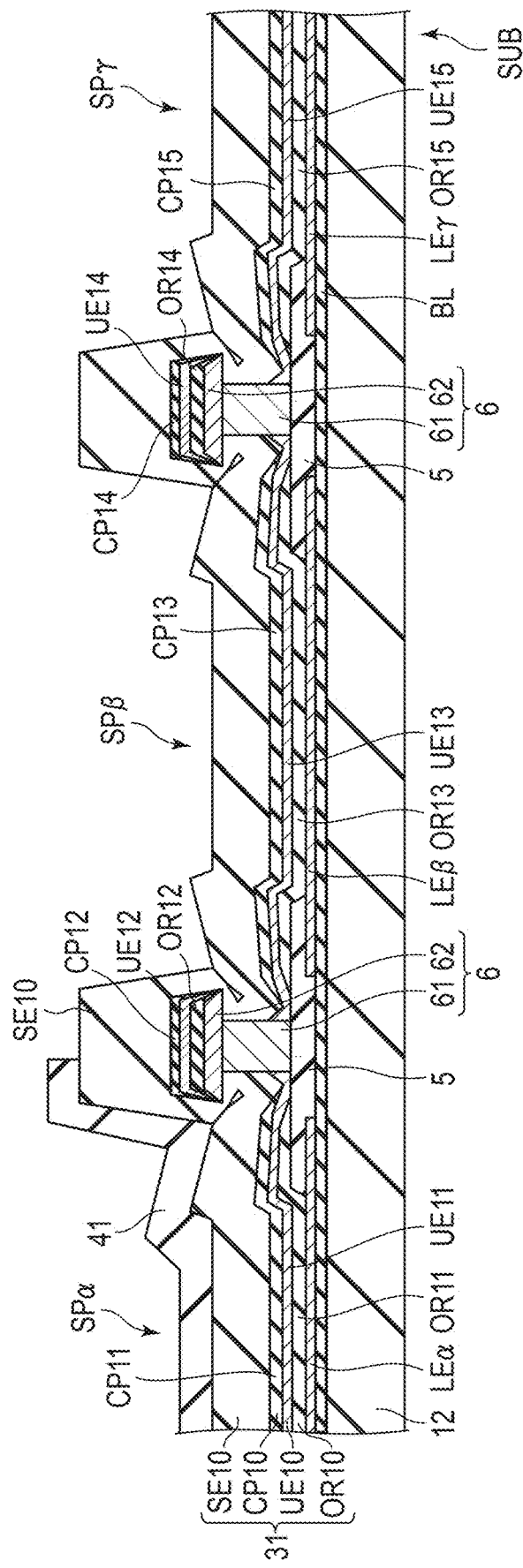
FIG. 9 is a diagram for explaining step ST22.

Subsequently, in step ST22, as shown in FIG. 9, a resist is applied onto the sealing layer SE10 and patterned. The first resist 41 formed by this patterning covers subpixel SPα. Thus, the first resist 41 is provided immediately above the lower electrode LEα, the first organic layer OR11, the first upper electrode UE11 and the first cap layer CP11. The first resist 41 extends from subpixel SPα to the upper side of the partition 6. Between subpixel SPα and subpixel SPβ, the first resist 41 is provided on the subpixel SPα side (the left side of the figure), and the sealing layer SE10 is exposed from the first resist 41 on the subpixel SPβ side (the right side of the figure). In the example shown in the figure, the sealing layer SE10 is exposed from the first resist 41 in subpixel SPβ and subpixel SPγ.

Subsequently, in step ST23, the first thin film 31 exposed from the first resist 41 is removed by performing etching using the first resist 41 as a mask. The process of removing the first thin film 31 includes the process of removing part of the sealing layer SE10, the process of removing part of the cap layer CP10, the process of removing part of the upper electrode UE10 and the process of removing part of the organic layer OR10.

Figure 10:
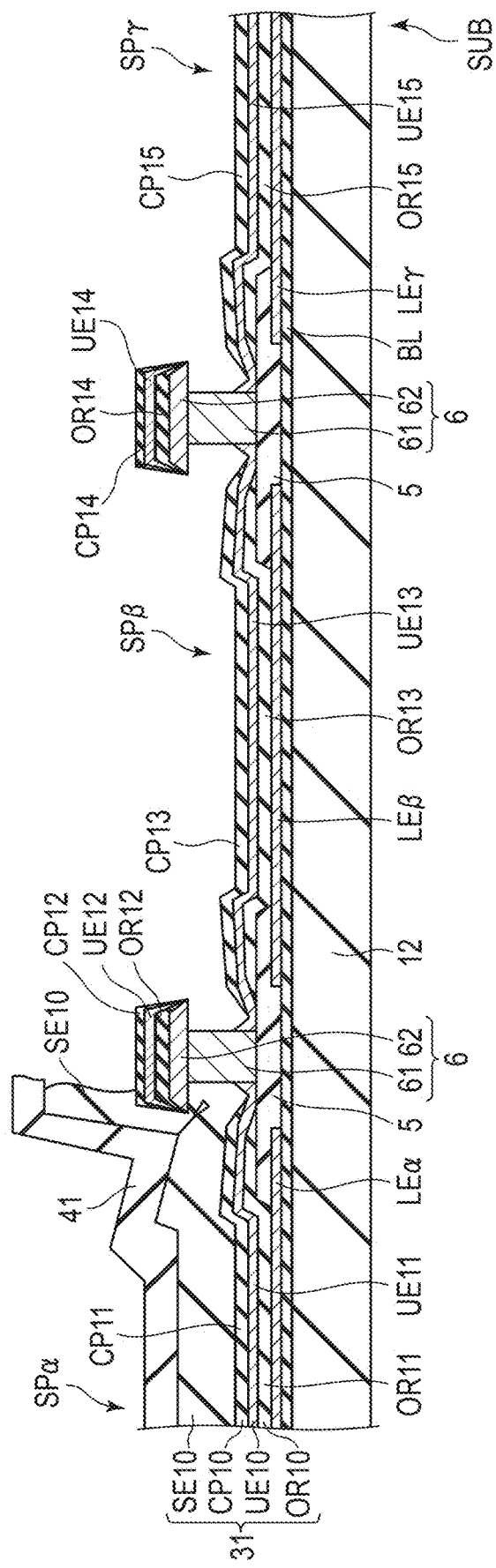
FIG. 10 is a diagram for explaining step ST23.

First, as shown in FIG. 10, dry etching is performed using the first resist 41 as a mask to remove, of the sealing layer SE10, the portion exposed from the first resist 41. In the example shown in the figure, of the sealing layer SE10, the portion which covers subpixel SPα (the portion which covers the first cap layer CP11) and the portion on the subpixel SPα side (the left side of the figure) immediately above the partition 6 (the portion which covers the subpixel SPα side in the second cap layer CP12) remain. To the contrary, of the sealing layer SE10, the portion on the subpixel SPβ side (the right side of the figure) immediately above the partition 6 (the portion which covers the subpixel SPβ side in the second cap layer CP12), the portion which covers subpixel SPβ (the portion which covers the third cap layer CP13), the portion which covers the partition 6 between subpixel SPβ and subpixel SPγ (the portion which covers the fourth cap layer CP14) and the portion which covers subpixel SPγ (the portion which covers the fifth cap layer CP15) are removed. By this process, part of the second cap layer CP12, the third cap layer CP13, the fourth cap layer CP14 and the fifth cap layer CP15 are exposed from the sealing layer SE10.

As explained with reference to FIG. 8, for example, in a case where the sealing layer SE10 is in contact with the rib 5 near the partition 6 of subpixels SPβ and SPγ, the rib 5 may be damaged when the sealing layer SE10 is removed. However, even if the rib 5 is damaged, the barrier layer BL prevents the exposure of the insulating layer 12.

Figure 11:
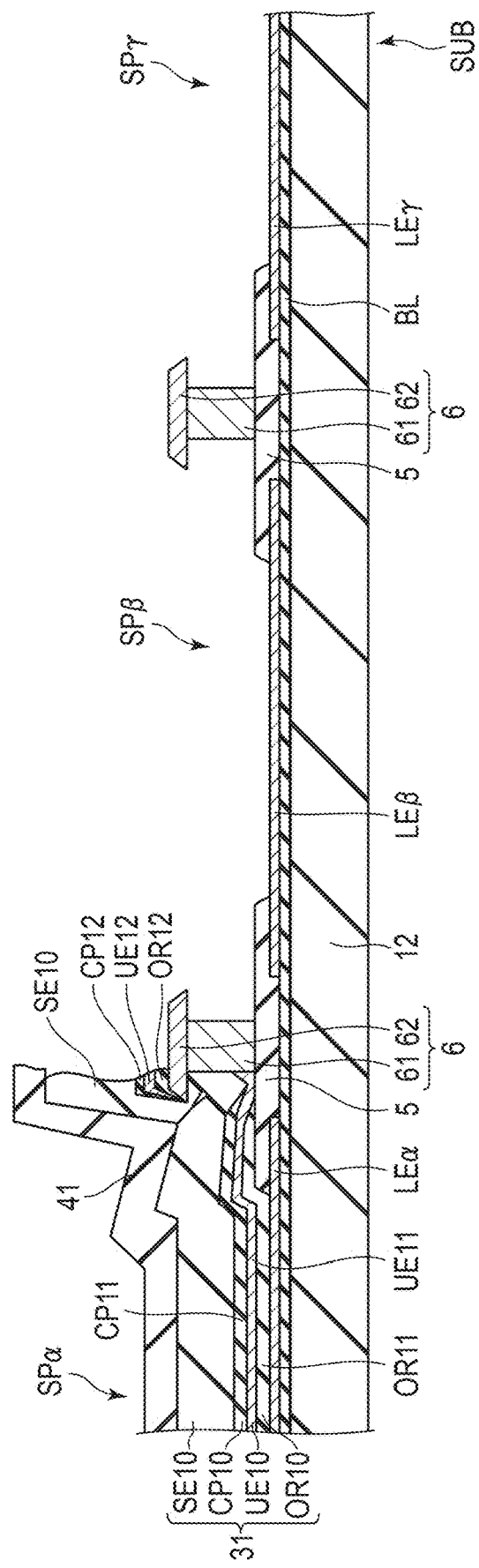
FIG. 11 is a diagram for explaining step ST23.

Subsequently, as shown in FIG. 11, etching is performed using the first resist 41 as a mask to remove, of the cap layer CP10, the portion exposed from the first resist 41 and the sealing layer SE10. In the example shown in the figure, part of the second cap layer CP12, the entire third cap layer CP13, the entire fourth cap layer CP14 and the entire fifth cap layer CP15 are removed.

Subsequently, etching is performed using the first resist 41 as a mask to remove, of the upper electrode UE10, the portion exposed from the first resist 41, the sealing layer SE10 and the cap layer CP10. In the example shown in the figure, part of the second upper electrode UE12, the entire third upper electrode UE13, the entire fourth upper electrode UE14 and the entire fifth upper electrode UE15 are removed.

Subsequently, etching is performed using the first resist 41 as a mask to remove, of the organic layer OR10, the portion exposed from the first resist 41, the sealing layer SE10, the cap layer CP10 and the upper electrode UE10. In the example shown in the figure, part of the second organic layer OR12, the entire third organic layer OR13, the entire fourth organic layer OR14 and the entire fifth organic layer OR15 are removed.

Thus, the lower electrode LEβ is exposed in subpixel SPβ, and the lower electrode LEγ is exposed in subpixel SPγ.

Regarding the partition 6 between subpixel SPα and subpixel SPβ, immediately above the upper portion 62, the second organic layer OR12, the second upper electrode UE12, the second cap layer CP12 and the sealing layer SE10 remain on the subpixel SPα side, and the second organic layer OR12, the second upper electrode UE12, the second cap layer CP12 and the sealing layer SE10 are removed on the subpixel SPβ side. Thus, the subpixel SPβ side of the partition 6 is exposed.

The partition 6 between subpixel SPβ and subpixel SPγ is also exposed.

Figure 12:
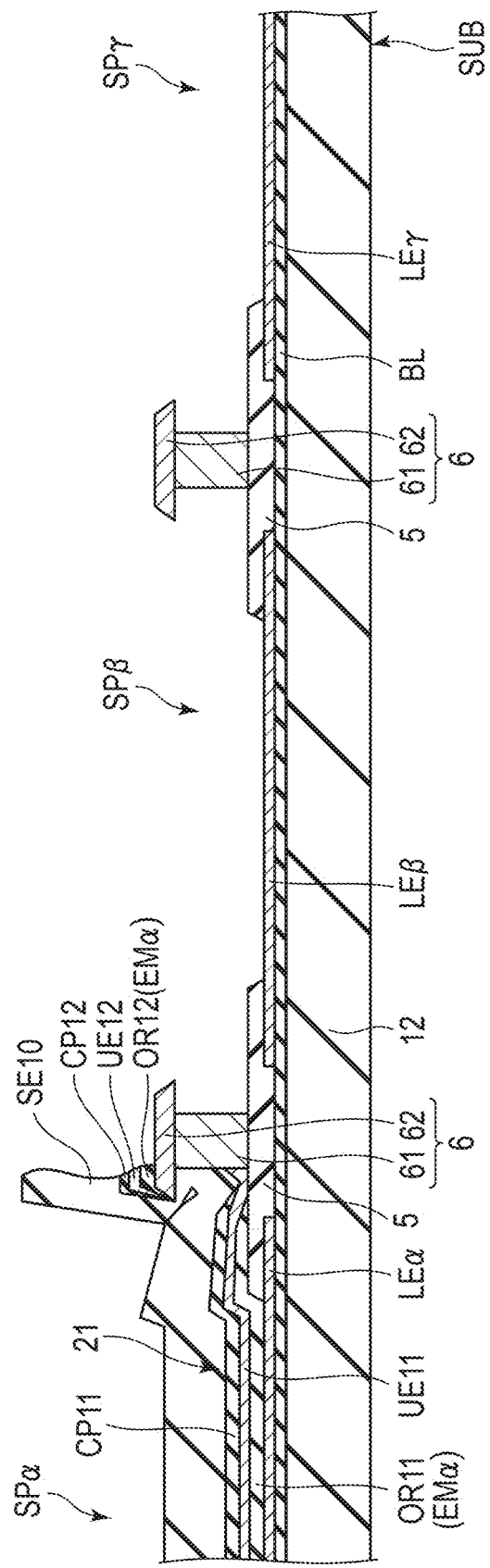
FIG. 12 is a diagram for explaining step ST24.

Subsequently, in step ST24, as shown in FIG. 12, the first resist 41 is removed. Thus, the sealing layer SE10 of subpixel SPα is exposed. Through these steps ST21 to ST24, the display element 21 is formed in subpixel SPα. The display element 21 consists of the lower electrode LEα, the first organic layer OR11 including the first light emitting layer EMα, the first upper electrode UE11 and the first cap layer CP11. The display element 21 is covered with the sealing layer SE10.

A stacked layer body of the second organic layer OR12 including the first light emitting layer EMα, the second upper electrode UE12 and the second cap layer CP12 is formed on the partition 6 between subpixel SPα and subpixel SPβ. This stacked layer body is covered with the sealing layer SE10. Of the partition 6, the portion on the subpixel SPα side is covered with the sealing layer SE10.

The subpixel SPα of the above example is one of the subpixels SP1, SP2 and SP3 shown in FIG. 2. For example, when subpixel SPα corresponds to subpixel SP1, the following relationships are applied. The lower electrode LEα corresponds to the lower electrode LE1. The first organic layer OR11 corresponds to the first portion OR1a. The second organic layer OR12 corresponds to the second portion OR1b. The first light emitting layer EMα corresponds to the light emitting layer EM1. The first upper electrode UE11 corresponds to the first portion UE1a. The second upper electrode UE12 corresponds to the second portion UE1b. The first cap layer CP11 corresponds to the first portion CP1a. The second cap layer CP12 corresponds to the second portion CP1b. The sealing layer SE10 corresponds to the sealing layer SE1.

In the present embodiment, the barrier layer BL which is an inorganic insulating layer is provided between the rib 5 which is an inorganic insulating layer and the insulating layer 12 which is an organic insulating layer. The barrier layer BL is formed of an inorganic insulating material which is different from the materials of the rib 5 and the sealing layer SE10. For example, the rib 5 and the sealing layer SE10 are formed of silicon nitride. The barrier layer BL is formed of silicon oxide (Si) or silicon oxynitride (SiON) which is a material having a high resistance to dry etching compared to silicon nitride (SiN).

Thus, even if the sealing layer SE10 is provided so as to be in contact with the rib 5, and the rib 5 is damaged at the time of the dry etching of the sealing layer SE10, the barrier layer BL located immediately under the rib 5 prevents the exposure of the insulating layer 12. This configuration prevents the formation of an undesired hole (penetration path for moisture) from the rib 5 to the insulating layer 12. Thus, a moisture path from the insulating layer 12 to the organic layer OR10 and a moisture path from the insulating layer 12 to the upper electrode UE10 are interrupted, thereby preventing moisture from degrading the organic layer OR10 and the upper electrode UE10. In this way, the reduction in reliability can be prevented.

Now, this specification explains another configuration example of the display device.

FIG. 13 is a plan view showing another configuration example of the barrier layer BL. FIG. 13 shows only the barrier layer BL and the lower electrodes LE1, LE2 and LE3. The other structural elements are omitted in the figure.

As seen in plan view, the end portions of the lower electrodes LE1, LE2 and LE3 overlap the barrier layer BL. The barrier layer BL comprises the aperture AP11 overlapping the contact hole CH1, the aperture AP12 overlapping the contact hole CH2 and the aperture AP13 overlapping the contact hole CH3.

The configuration example shown in FIG. 13 is different from the configuration example shown in FIG. 4 in respect that each of the apertures AP11, AP12 and AP13 is extended. The aperture AP11 is extended so as to overlap the contact hole CH1 and overlap the central portion of the lower electrode LE1. Similarly, the aperture AP12 is extended so as to overlap the contact hole CH2 and overlap the central portion of the lower electrode LE2. The aperture AP13 is extended so as to overlap the contact hole CH3 and overlap the central portion of the lower electrode LE3.

Figure 14:
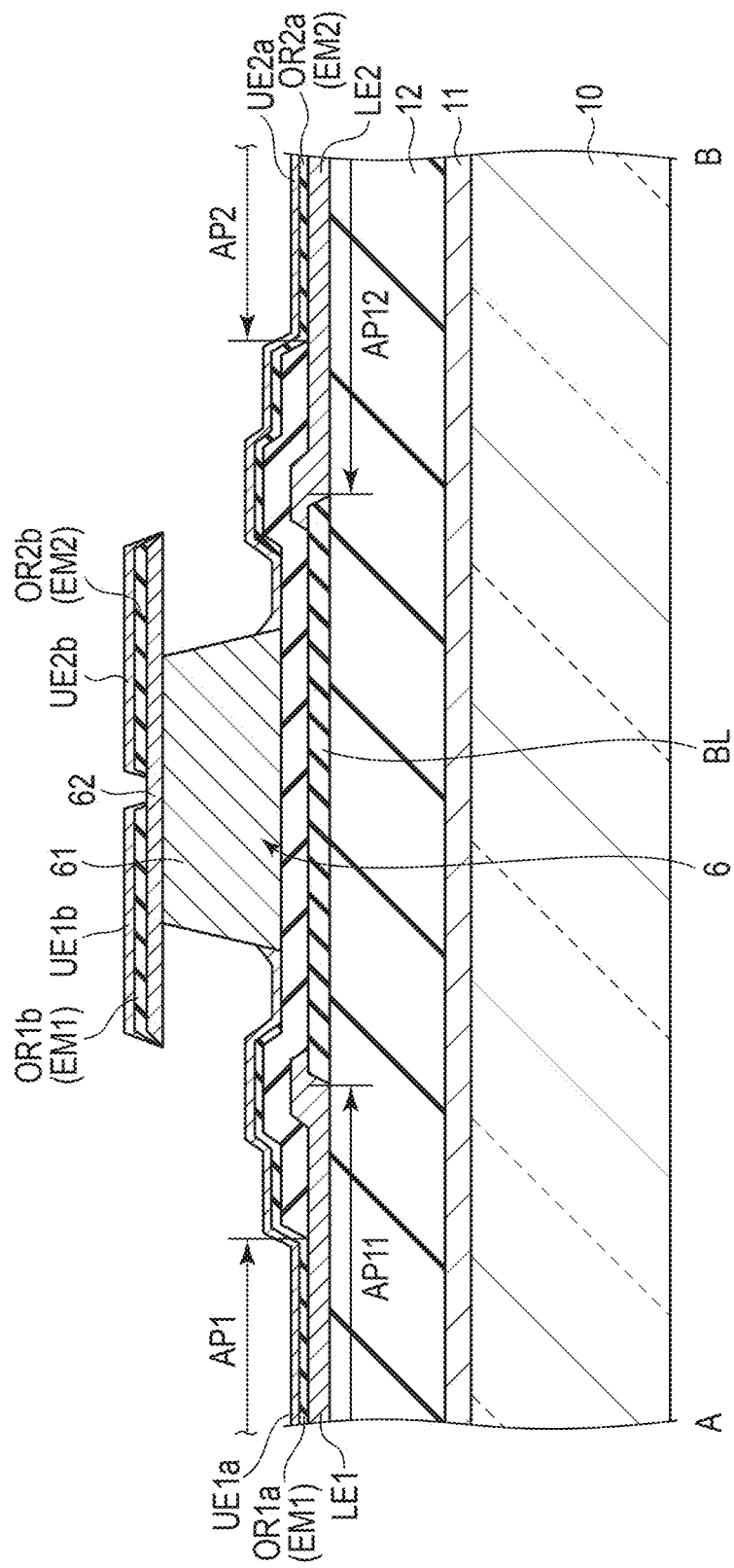
FIG. 14 is a cross-sectional view showing another configuration example of the display device.

FIG. 14 is a cross-sectional view showing another configuration example of the display device. FIG. 14 shows the section of the main part along the A-B line of FIG. 13. The illustrations of the cap layer and the sealing layer are omitted.

The barrier layer BL is provided on the insulating layer 12. The aperture AP11 of the barrier layer BL overlaps the aperture AP1 of the rib 5. The aperture AP12 overlaps the aperture AP2. The lower electrodes LE1 and LE2 are provided on the insulating layer 12. Each of the end portion of the lower electrode LE1 and the end portion of the lower electrode LE2 is provided between the barrier layer BL and the rib 5. Between the partition 6 and the lower electrode LE1 and between the partition 6 and the lower electrode LE2, the barrier layer BL is provided between the insulating layer 12 and the rib 5. The barrier layer BL is located immediately under the partition 6 and covers the insulating layer 12 between the lower electrode LE1 and the lower electrode LE2.

At a position overlapping the aperture AP1 of the rib 5, the lower electrode LE1 is provided on the insulating layer 12 without the intervention of the barrier layer BL. At a position overlapping the aperture AP2 of the rib 5, the lower electrode LE2 is provided on the insulating layer 12 without the intervention of the barrier layer BL. Similarly, the lower electrode LE3 which is not shown in the figure is provided on the insulating layer 12 without the intervention of the barrier layer BL at a position overlapping the aperture AP3 of the rib 5.

In this configuration example, effects similar to those of the above description can be obtained.

Figure 15:
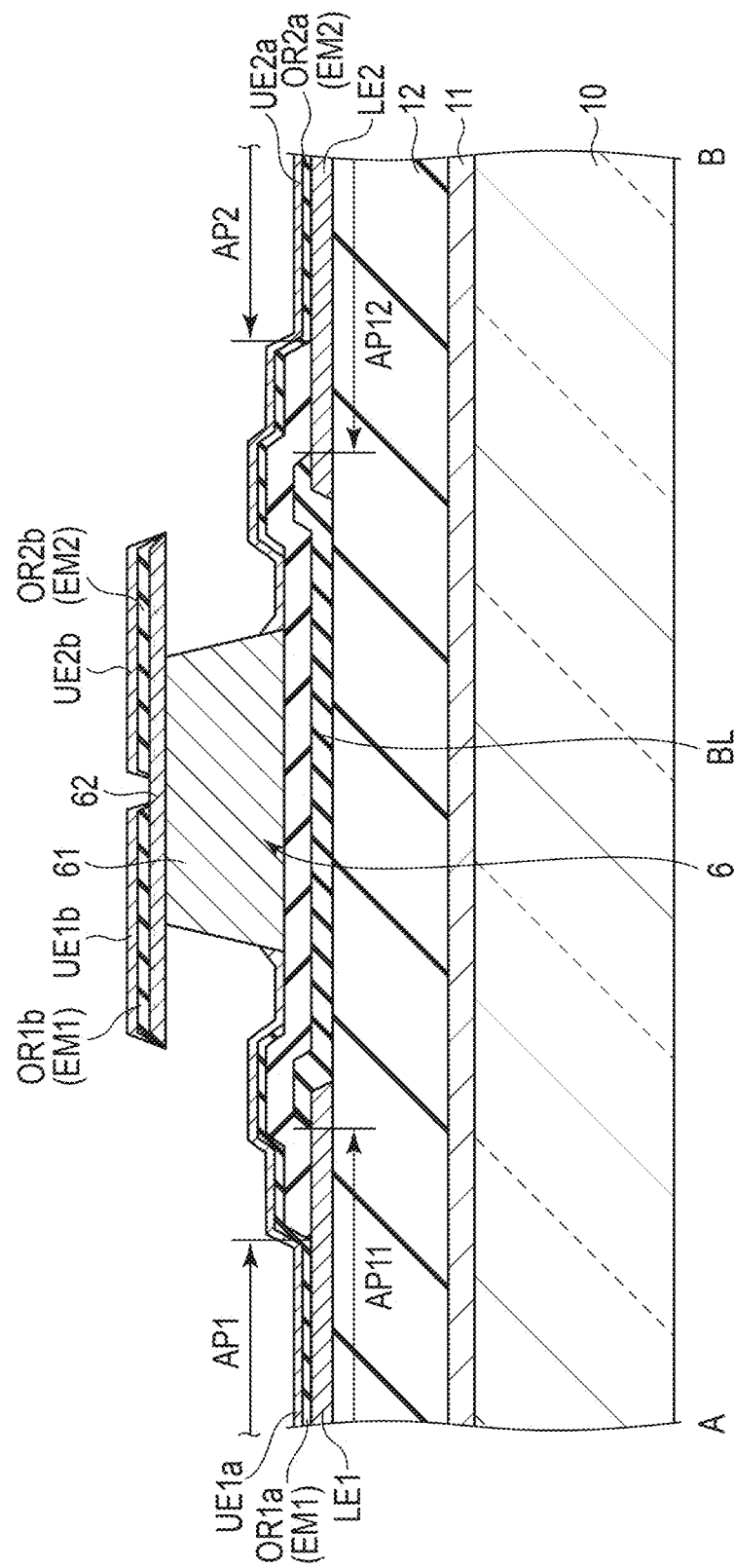
FIG. 15 is a cross-sectional view showing another configuration example of the display device.

FIG. 15 is a cross-sectional view showing another configuration example of the display device. FIG. 15 shows the section of the main part along the A-B line of FIG. 13. The illustrations of the cap layer and the sealing layer are omitted.

The configuration example shown in FIG. 15 is different from the configuration example shown in FIG. 14 in respect that each of the end portion of the lower electrode LE1 and the end portion of the lower electrode LE2 is provided between the insulating layer 12 and the barrier layer BL. Similarly, the end portion of the lower electrode LE3 which is not shown in the figure is provided between the insulating layer 12 and the barrier layer BL. The entire barrier layer BL is covered with the rib 5.

In a manner similar to that of the configuration example of FIG. 14, between the partition 6 and the lower electrode LE1 and between the partition 6 and the lower electrode LE2, the barrier layer BL is provided between the insulating layer 12 and the rib 5. The barrier layer BL is located immediately under the partition 6 and covers the insulating layer 12 between the lower electrode LE1 and the lower electrode LE2.

In this configuration example, effects similar to those of the above description can be obtained.

FIG. 16 is a cross-sectional view showing another configuration example of the display device. In FIG. 16, the illustrations of the cap layer and the sealing layer are omitted.

The configuration example shown in FIG. 16 is different from the configuration example shown in FIG. 14 in respect that each of the end portion of the lower electrode LE1 and the end portion of the lower electrode LE2 is spaced apart from the barrier layer BL. Each of the lower electrode LE1 and the lower electrode LE2 is provided on the insulating layer 12. Each of the end portion of the lower electrode LE1 and the end portion of the lower electrode LE2 is covered with the rib 5. The entire barrier layer BL is covered with the rib 5. The rib 5 covers the insulating layer 12 between the lower electrode LE1 and the barrier layer BL and between the lower electrode LE2 and the barrier layer BL.

In this configuration example, effects similar to those of the above description can be obtained.

As explained above, the present embodiment can provide a display device which can prevent the reduction in reliability and have an improved manufacturing yield.

All of the display devices that can be implemented by a person of ordinary skill in the art through arbitrary design changes to the display device described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiment and are self-explanatory from the descriptions of the specification or can be arbitrarily conceived by a person of ordinary skill in the art are considered as the effects of the present invention as a matter of course.

What is claimed is:

1. A display device comprising:
   a substrate;
   an organic insulating layer provided above the substrate;
   a barrier layer formed of an inorganic insulating material and provided on the organic insulating layer;
   a rib formed of an inorganic insulating material and provided on the barrier layer;
   a partition comprising a lower portion located immediately above the barrier layer and provided on the rib, and an upper portion provided on the lower portion and protruding from a side surface of the lower portion;
   a lower electrode comprising an end portion between the organic insulating layer and the rib;
   an organic layer comprising a first portion provided on the lower electrode in an aperture of the rib and spaced apart from the lower portion of the partition, and a second portion provided on the upper portion, the first and second portions including light emitting layers formed of a same material;
   an upper electrode comprising a first portion which is provided on the first portion of the organic layer and is in contact with the lower portion of the partition, and a second portion provided on the second portion of the organic layer;
   a cap layer comprising a first portion provided on the first portion of the upper electrode, and a second portion provided on the second portion of the upper electrode; and
   a sealing layer which covers the first and second portions of the cap layer.

2. The display device of claim 1, wherein
between the side surface of the partition and the end portion of the lower electrode, the barrier layer is provided between the organic insulating layer and the rib.

3. The display device of claim 2, wherein
the end portion of the lower electrode is provided between the barrier layer and the rib.

4. The display device of claim 3, wherein
at a position overlapping the aperture of the rib, the lower electrode is provided on the barrier layer.

5. The display device of claim 3, wherein
at a position overlapping the aperture of the rib, the lower electrode is provided on the organic insulating layer without intervention of the barrier layer.

6. The display device of claim 2, wherein
the end portion of the lower electrode is provided between the organic insulating layer and the barrier layer.

7. The display device of claim 2, wherein
the end portion of the lower electrode is spaced apart from the barrier layer.

8. The display device of claim 1, wherein
the barrier layer and the rib are formed of inorganic insulating materials different from each other.

9. The display device of claim 1, wherein
the barrier layer is formed of silicon oxide or silicon oxynitride, and
the rib is formed of silicon nitride.

10. The display device of claim 1, wherein
the rib and the sealing layer are formed of a same inorganic insulating material.

11. The display device of claim 1, wherein
the rib and the sealing layer are formed of silicon nitride.

12. The display device of claim 1, wherein
the barrier layer and the sealing layer are formed of inorganic insulating materials different from each other.

13. The display device of claim 1, wherein
the barrier layer is formed of silicon oxide or silicon oxynitride, and
the sealing layer is formed of silicon nitride.

14. The display device of claim 1, wherein
the lower portion of the partition is formed of a conductive material, and is electrically connected to the first portion of the upper electrode.

* * * * *